United States Patent [19]
Fetterman et al.

[11] Patent Number: 5,939,904
[45] Date of Patent: Aug. 17, 1999

[54] METHOD AND APPARATUS FOR CONTROLLING THE COMMON-MODE OUTPUT VOLTAGE OF A DIFFERENTIAL BUFFER

[75] Inventors: H. Scott Fetterman, New Tripoli; David A. Rich, Whitehall, both of Pa.

[73] Assignee: Lucent Technologies, Inc., Murray Hill, N.J.

[21] Appl. No.: 09/026,211

[22] Filed: Feb. 19, 1998

[51] Int. Cl.⁶ .................................................. H03K 5/22
[52] U.S. Cl. ................................ 327/67; 327/65; 330/258
[58] Field of Search .................................. 330/253, 258; 327/65, 66, 67, 77, 87, 560–563, 363

[56] References Cited

U.S. PATENT DOCUMENTS

| | | | |
|---|---|---|---|
| 4,904,953 | 2/1990 | McCormack | 330/258 |
| 5,239,210 | 8/1993 | Scott | 327/63 |
| 5,281,924 | 1/1994 | Maloberti et al. | 330/258 |
| 5,319,316 | 6/1994 | Fensch | 330/258 |
| 5,475,323 | 12/1995 | Harris et al. | 327/67 |
| 5,491,447 | 2/1996 | Goetschel et al. | 330/254 |
| 5,703,532 | 12/1997 | Shin et al. | 330/253 |

FOREIGN PATENT DOCUMENTS

| | | | |
|---|---|---|---|
| 55-3217 | 1/1980 | Japan | 330/258 |
| 58-57806 | 4/1983 | Japan | 330/258 |

*Primary Examiner*—Toan Tran
*Attorney, Agent, or Firm*—Synnestvedt & Lechner LLP

[57] ABSTRACT

A method and device for controlling the common-node output voltage of a differential buffer is disclosed. According to the invention, the common-mode output voltage of the differential buffer is controlled to a desired value by supplying a first current to the output of the differential buffer and supplying a second current to the output of the differential buffer, the second current being opposite in polarity and lower in magnitude than the first current. The common-mode output voltage of the differential buffer is sensed and an adjustment current is added to the second current to adjust the common-mode output voltage to the desired value.

35 Claims, 5 Drawing Sheets

METHOD AND APPARATUS FOR CONTROLLING THE COMMON-MODE OUTPUT VOLTAGE OF A DIFFERENTIAL BUFFER

FIELD OF THE INVENTION

This invention relates generally to a method and apparatus for controlling the common-mode output voltage of a differential buffer, and is particularly useful for use with LVDS (Low Voltage Differential Signaling) output buffers.

DESCRIPTION OF THE PRIOR ART

A LVDS digital output buffer operates by changing the direction of current flow through circuitry placed between the buffers' two outputs (Z and ZB), in correspondence to the level of a digital input. The polarity of voltage developed across this circuitry is sensed by a receiver to recover the original digital level that was input to the buffer. To insure that the receiver functions properly, the common-mode output voltage of the buffer (the average value of the two outputs Z and ZB relative to ground) must be constrained to a specified range. A typical LVDS output buffer comprises a positive current source, negative current source, a means to switch the direction of current flow, and an operational amplifier (OPAMP) for setting the required output common-mode voltage.

The output common-mode voltage of a typical buffer can be controlled by varying the magnitude of the negative current source (alternatively called the tail current source). This is accomplished by an OPAMP based feedback loop controlling the tail current source magnitude. FIG. 1 shows a prior art LVDS output buffer 10. The LVDS output buffer 10 has two outputs, Z and ZB. Internal resistor R1 and R2 of equal value, are placed in series between the outputs Z and ZB and sense, at node MID, the common-mode voltage of the outputs Z and ZB. The voltage at nodes Z and ZB, relative to MID, are equal in magnitude but of opposite polarity.

An external resistor $R_{EXT}$ is placed across the nodes Z and ZB, and bias current source IB and transistors MB and M4 form a positive current source that sets up the current which will eventually flow through $R_{EXT}$. Transistors M1, M2, M5 and M6 switch the direction of current flow in $R_{EXT}$ thereby changing the polarity of the voltage developed across $R_{EXT}$ dependent upon the value of AD and ADB (ADB is always the inverted value of AD, e.g., if AD is a digital 1, ADB will be a digital 0, and vice versa). The amount of current flowing in transistor M3 (the tail current source) determines, i.e., controls, the common-mode voltage of the outputs Z and ZB.

To control the current in transistor M3 and thereby control the output common-mode voltage, an OPAMP based feedback loop is used to compare the common-mode voltage ($V_{MID}$) at node MID to a desired common-mode output voltage (VCM). The common-mode voltage $V_{MID}$ sensed at node MID is fed into the OPAMP and is compared with VCM. The output of the OPAMP (node 5) controls the current drawn by transistor M3. Thus, transistor M4 outputs a fixed bias current (ratioed from IB) and the common-mode voltage $V_{MID}$ is changed by varying exactly how much current transistor M3 is drawing. If it is desired to raise the common-mode voltage of the output, the amount of current drawn by transistor M3 is decreased. The OPAMP senses the difference—up or down—between the actual common-mode voltage $V_{MID}$ as sensed at node MID and the desired common-mode voltage VCM, and drives transistor M3 to control the output common-mode voltage to compensate for the difference.

Many factors are considered in designing integrated circuits including the physical size, the temperature characteristics and the power requirements of the components that make up the IC. A very simple operational amplifier generally comprises at least 5–7 transistors. Further, a high-gain OPAMP can oscillate, causing instability or improper operation of the circuit. To insure stability the OPAMP must be compensated which results in delayed correction of the common-mode output voltage due to changes in the common-mode voltage at MID. This delay may temporarily result in the output common-mode voltage not falling within the desired range. Thus, it would be desirable to simplify the common-mode control by reducing the number of components required, decreasing the power and temperature factors, and still provide stable control of the common-mode voltage.

SUMMARY OF THE PRESENT INVENTION

It is therefore an object of the present invention to provide an improved method and device for controlling the output common-mode voltage of a differential buffer.

It is another object of the present invention to provide an improved method and device for controlling the output common-mode of a differential buffer using a reduced number of components and having decreased power, size, and temperature factors.

It is also an object of the present invention to provide a device (or an integrated circuit including a device) for controlling the common-mode output voltage of a differential buffer to a desired value, comprising a first current source providing a first current to the output of said differential buffer; a second current source providing a second current to the output of said differential buffer, said second current being opposite in polarity and lower in magnitude than said first bias current; sensing means for sensing the common-mode output voltage of said differential amplifier and providing an adjustment current at a node of said sensing means; and adding means for adding said adjustment current to said second current to adjust the common-mode output voltage to said desired value.

It is a further object of the present invention to provide a method of controlling the common-mode output voltage of a differential buffer to a desired value, comprising the steps of supplying a first current to the output of said differential buffer; supplying a second current to the output of said differential buffer, said second current being opposite in polarity and lower in magnitude than said first current; sensing the common-mode output voltage of said differential buffer and providing an adjustment current at a node of said sensing means; and adding said adjustment current to said second current to adjust the common-mode output voltage to said desired value.

DETAILED DESCRIPTIONS OF THE PREFERRED EMBODIMENTS

Figure 1:
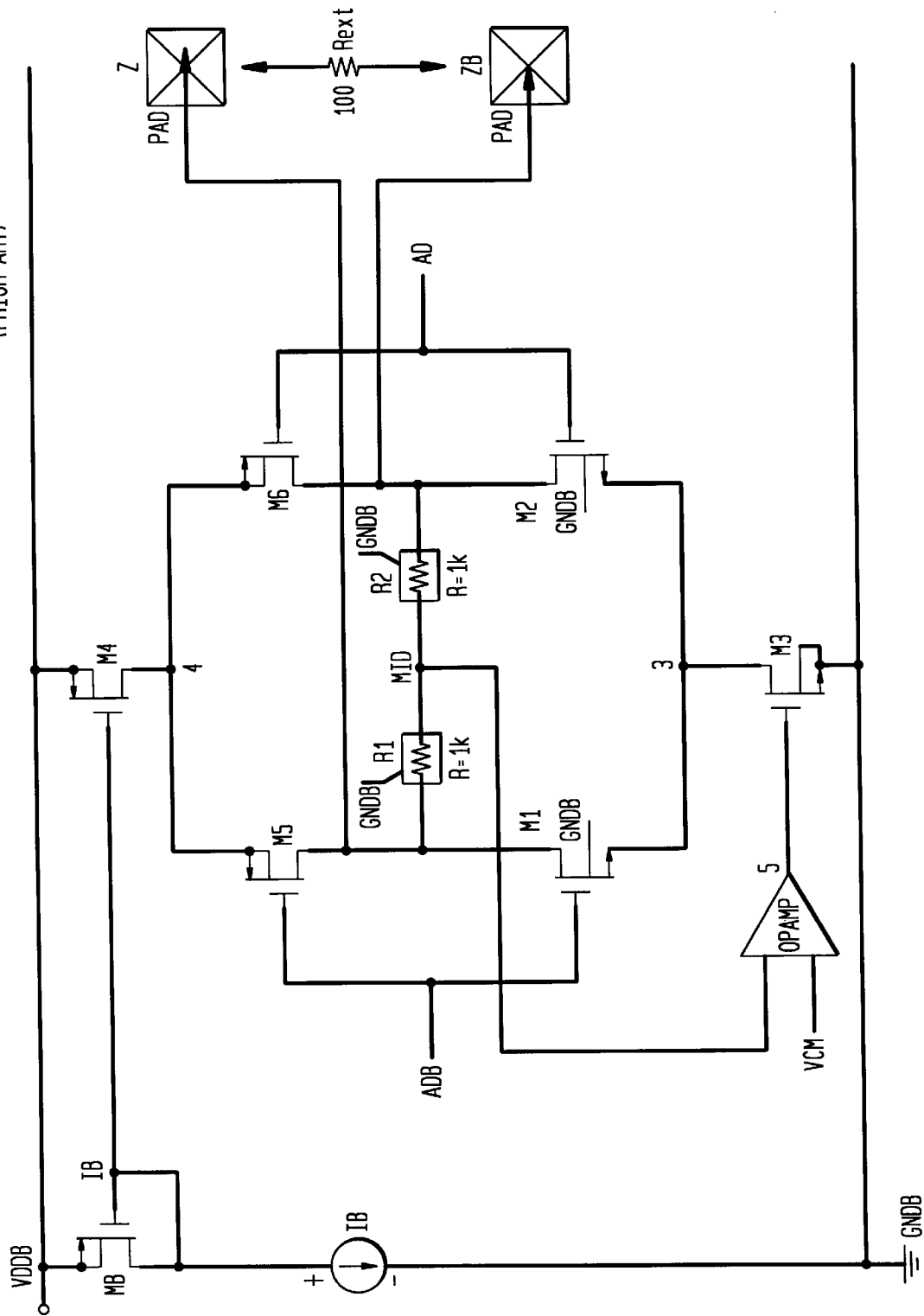
FIG. 1 is schematic drawing of a prior art LVDS buffer circuit.
Figure 2:
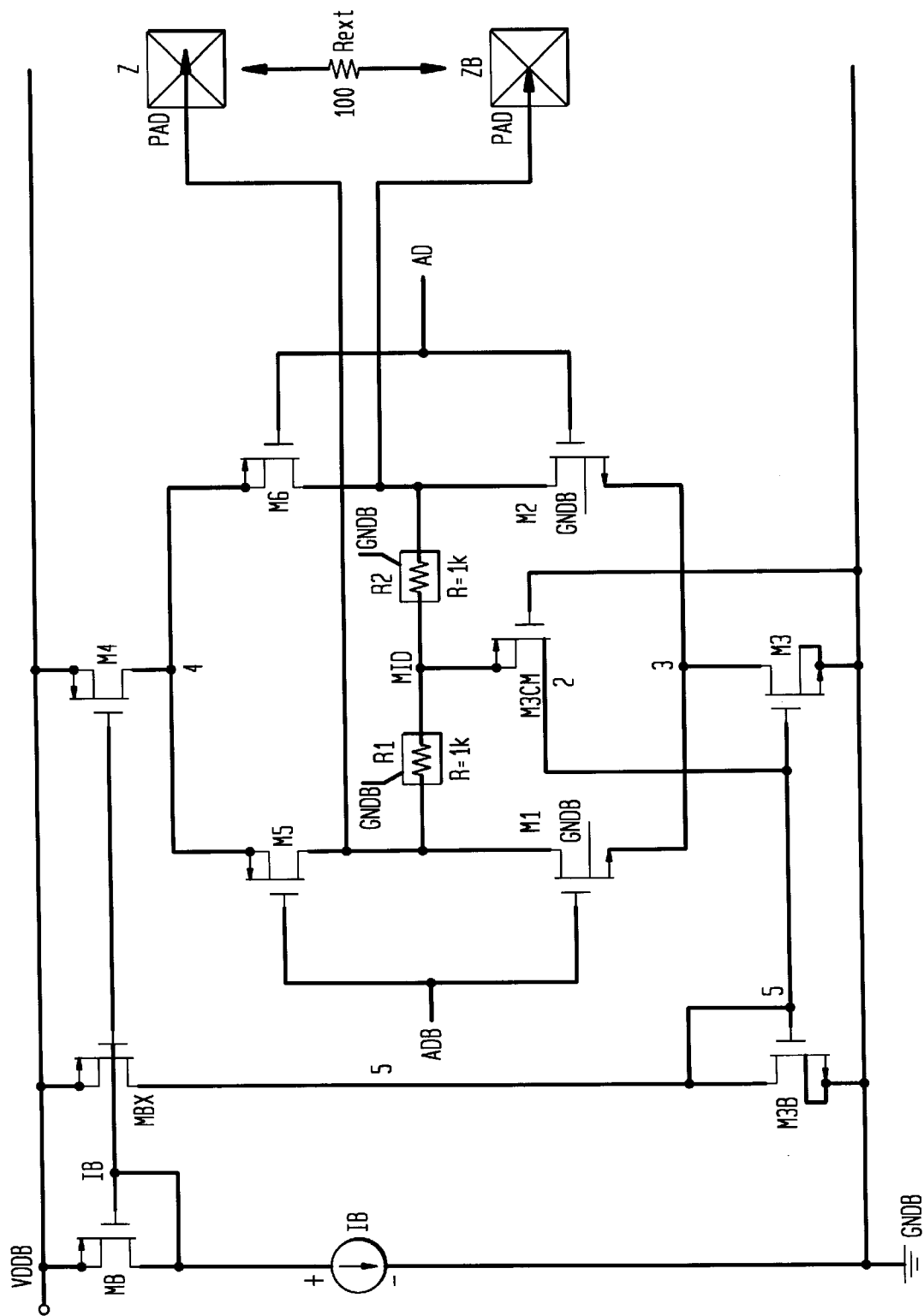
FIG. 2 is a schematic drawing of a first embodiment of a common-mode output voltage control circuit according to the present invention.

In FIG. 2, a first embodiment of the present invention is shown with an LVDS output buffer in which the OPAMP of FIG. 1 is removed. As with the prior art circuit, transistors MB and M4 comprise a positive current source and supply current into node 4. Transistor M3 is still drawing current away from node 3 and thus the common-mode voltage is still controlled by varying the current drawn by transistor M3.

In this circuit, however, the current in transistor M3 is varied without using an OPAMP. The bias current (IB) flowing in transistor MB still develops a ratioed current in M4. However, a transistor MBX on the IB bias rail sends a "copy" of MB's current into node 5, where it flows through diode connected transistor M3B. Since transistor M3 shares the node 5 bias rail with M3B, M3 draws a current from node 3 that is ratioed to the input bias current IB. The combination of transistors MBX, M3B, and M3 form a negative current source. However, the value of the current drawn by this negative current source is deliberately selected to be smaller than the current supplied by the positive current source comprising transistors MB and M4. The W/L ratio of transistors M3B and M3 are selected to create a current in transistor M3 which is approximately 70% of the current flowing in transistor M4. By way of example only, if the W/L ratios of transistors MBX, M4, M3B, and M3 are selected to be 25/0.7; 12×25/0.7; 36/0.6; and 10×30/0.6, respectivley, an appropriate ratio is achieved.

With this variance in current between transistors M3 and M4, the common-mode voltage $V_{MID}$ would increase up to the positive rail ($V_{DDB}$). To avoid this, transistor M3CM, a P-channel transistor, is placed in a common-gate configuration between the common-mode sense point mode MID and node 5 to provide negative feedback which, in turn, controls the output common-mode voltage.

P-channel transistor M3CM is placed with its source and bulk nodes connected to node MID, the gate grounded and the drain connected to node 5. The bulk node could also be connected to $V_{DDB}$. In this configuration, current flows from node MID into the diode connected transistor M3B when the voltage $V_{MID}$ is greater than≈$V_t$ ($V_t$ is the threshold voltage of transistor M3B) which in this technology is≈1V. With transistor M3CM's gate grounded, the output common-mode voltage VMD is set at approximately 1 volt (the approximate $V_{GS}$ of a P-channel device). Since the gate of transistor M3CM is grounded, if the voltage at node MID goes above 1 volt, current will start to flow down from node MID through transistor M3CM to node 5 and into transistor M3B. The current flows through transistor M3B on its way to ground and, since transistor M3B is receiving more current than before (the current being provided by transistor M3CM), the $V_{GS}$ of M3 is increased, thereby increasing the current drawn out of node 3 by transistor M3. When this additional current flows through transistor M3B it in turn increases the current in transistor M3 which in turn lowers the output common-mode voltage. Thus, transistors M3CM, MBX, M3B and M3 combine to provide the negative feedback as did the OPAMP in the prior art circuit.

To summarize, as $V_{MID}$ rises upwards, current flows through transistor M3CM into node 5, increasing the current drawn by transistor M3, thereby reducing $V_{MID}$ back down to the desired level (1 volt in this example).

Transistors MBX, M3B and M3CM, configured as shown in FIG. 2, provide means for increasing the $V_{GS}$ of M3 when $V_{MID}$ increases. The $V_{GS}$ of M3 will rise in correspondence to a rise in $V_{MID}$ due to the additional current flow in the impedance element (R3B or M3B) and cause $V_{MID}$ to drop back down.

Figure 3:
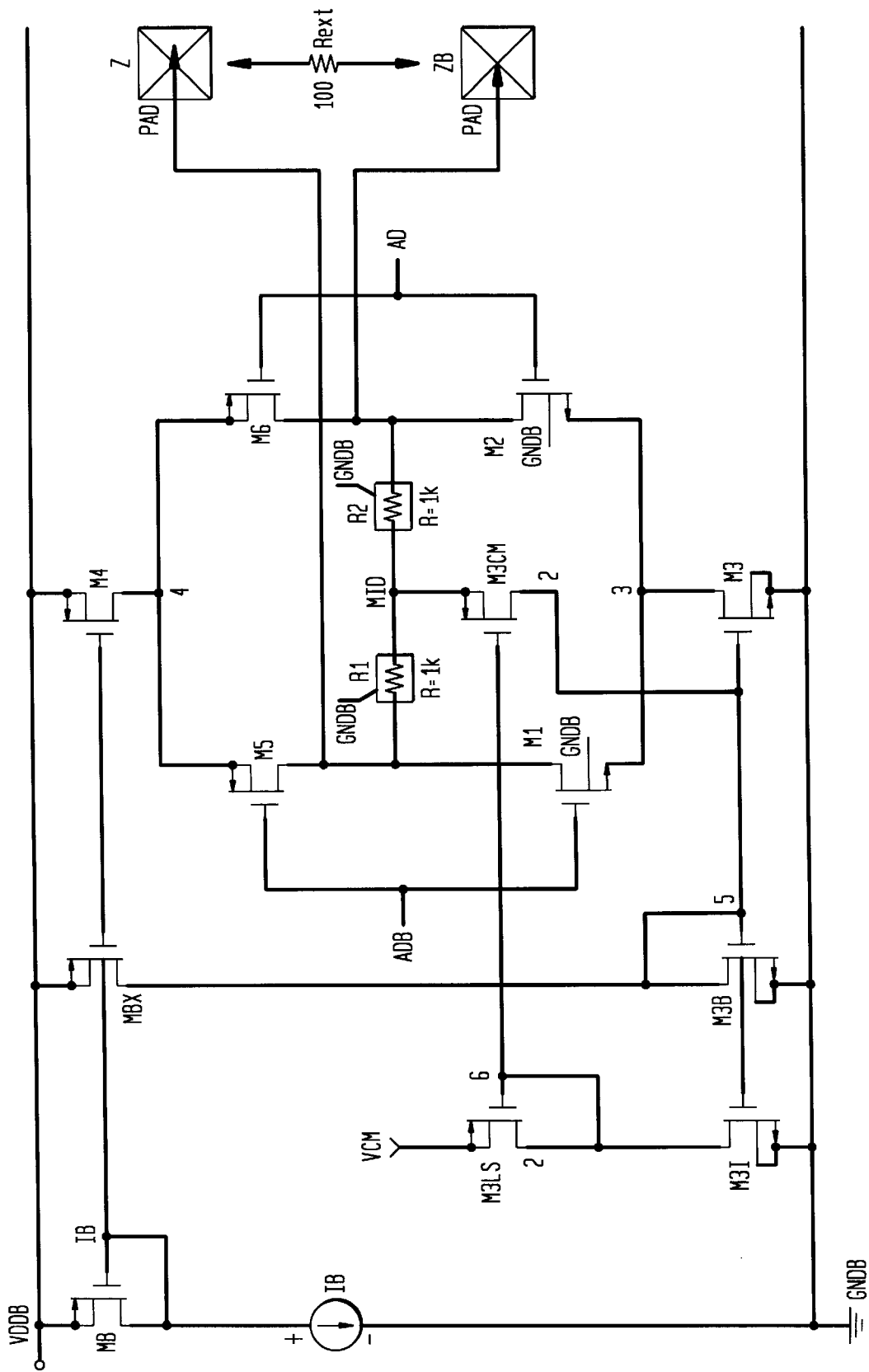
FIG. 3 is a schematic drawing of a second embodiment of a common-mode output voltage control circuit according to the present invention.

In the above example, the circuit of FIG. 2 shows a common-mode voltage output $V_{MID}$ of approximately 1 volt. This is the normal specification for an LVDS output buffer. It is not necessary, however, to limit the common-mode voltage to 1 volt. The addition of two transistors to the circuit of FIG. 2 allows the common-mode to be set to any voltage between approximately (GNDB+1 volt) and ($V_{DDB}$−1 volt). Referring to FIG. 3, instead of connecting the gate of M3CM to ground, it is instead connected to a variable voltage developed at node 6. Transistor M3LS is a is diode-connected P-channel device having its gate connected to node 6 and a desired common mode voltage VCM is connected to the source and bulk nodes of transistor M3LS. N-channel transistor M3I has its drain connected to the drain of M3LS and to node 6, and its source and bulk node are connected to ground. The gate of transistor M3I is connected to the gate of M3B. Thus, if the amount of current flowing through M3B changes, it will also change the current in M3I. M3I is sized such that its current is equal to or ratioed to the average current flowing in M3CM during normal operation. The current that M3I pulls through diode-connected transistor M3LS creates a $V_{GS}$ of M3LS which is equal to the nominal $V_{GS}$ of M3CM. The size of M3I is nominally one-third the size of M3B. Thus, diode connected P-channel M3LS provides at node 6 a level-shifted version (e.g., VCM reduced by the $V_{GS}$ of transistor M3LS) of the desired common-mode operating voltage VCM. Node 6 then is used to drive the gate of M3CM. Since the $V_{GS}$ drop of M3LS and M3CM should be about equal, $V_{MID}$ is effectively set to the VCM value. This circuit displays output common-mode regulation equivalent to the circuit of FIG. 2.

Transistors M3I and M3LS are ratioed to match transistors M3CM and M3. They do not need to be equal, e.g., transistors M3I and M3LS can be several times smaller than transistors M3CM and M3.

Once the circuit is configured as shown in FIG. 3, the current flowing through transistor M3LS is scaled to transistor M3CM such that transistor M3CM experiences the same $V_{GS}$ as transistor M3LS. Even though each one may be handling a different amount of current, transistors M3LS and M3CM are ratioed so that this equivalency of $V_{GS}$ exists. Transistor M3CM still transfers current from node MID into node 5, providing the negative feedback which controls the common-mode voltage. Transistors M3LS and M3I create a level-shifted version of VCM. Transistor M3LS is level-shifting the voltage from the desired common-mode voltage (VCM) down to the gate potential on M3CM that will be needed to make $V_{MID}$ equal to VCM. Transistor M3LS is level-shifting from VCM down to node 6 and transistor M3CM, in a sense, level-shifts up from node 6 to node MID by the same amount as the shift down, making VCM and $V_{MID}$ approximately the same.

As an example, if we assume that VCM is approximately two volts, node 6 will assume a voltage of approximately one volt because it takes about one volt to turn transistor M3LS on. Given that node 6 is≈1V, $V_{MID}$ will equal 1V plus the $V_{GS}$ of M3CM, or 2V. In other words, VCM is shifted down by the $V_{GS}$ of M3LS at node 6 and then shifted back up by the $V_{GS}$ of M3CM, resulting in $V_{MID}$ being approximately equal to VCM.

As the current flow through M3CM varies, to adjust the common mode voltage, that current also flows through M3B which, in turn, varies the current through M3I. This in turn varies the current flowing through transistor M3LS. Thus, as more current flows through M3CM, more current also flows through M3LS, and thus the $V_{GS's}$ of M3CM and M3LS change in the same sense and by about the same amount. This keeps VCM equal to $V_{MID}$ and allows the selection of a VCM voltage anywhere from approximately 1 to 4 volts if running from a 5 volt supply.

Figure 4:
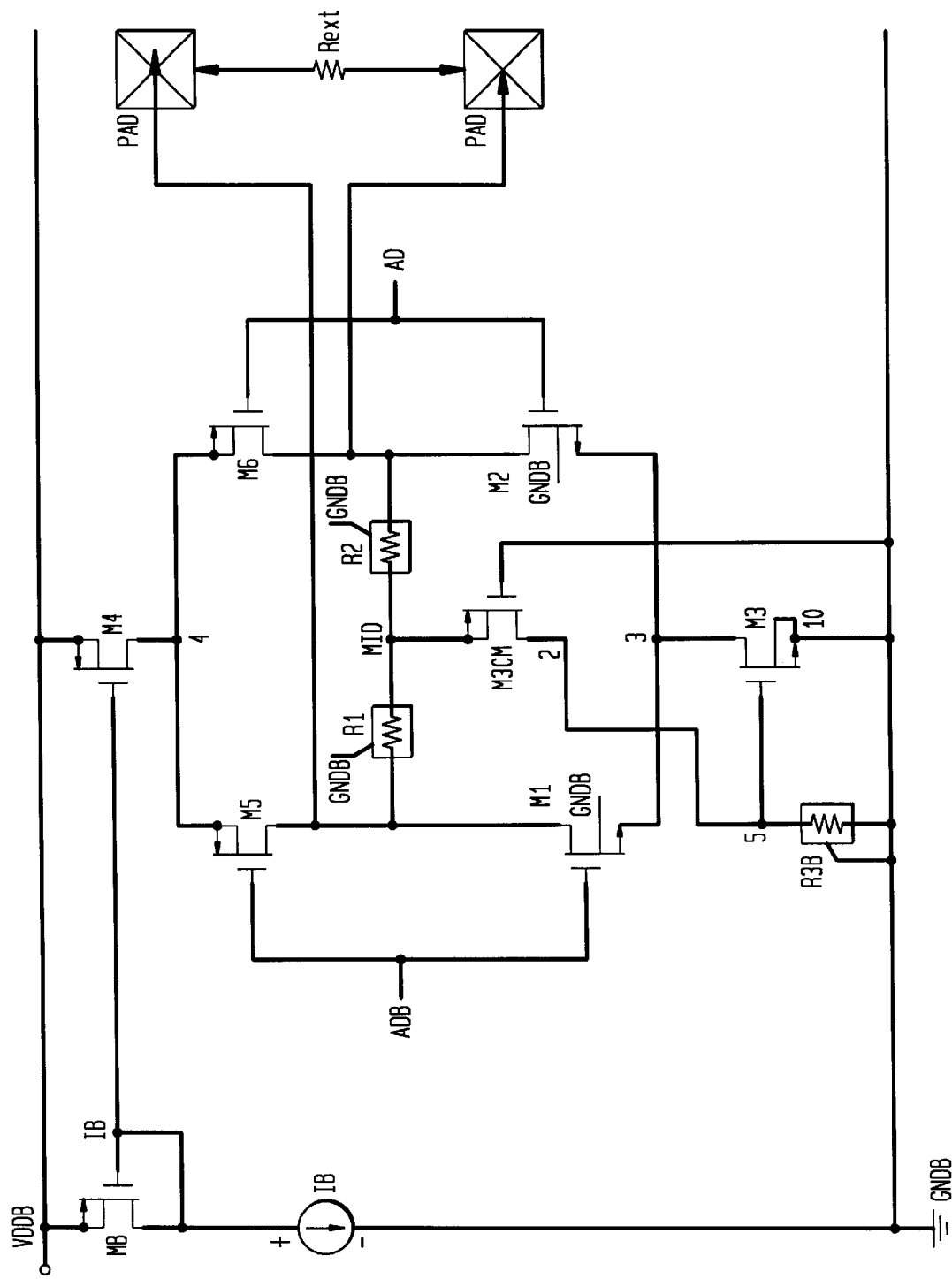
FIG. 4 is a schematic drawing of a third embodiment of a common-mode output voltage control circuit according to the present invention.

FIG. 4 shows an alternative embodiment to the circuit of FIG. 2. In FIG. 4, transistor MBX is removed and resistor R3B replaces transistor M3B. The function of resistor R3B is the same of that of transistor M3B, i.e., resistor R3B introduces an impedance at the controlling node of transistor M3, thereby increasing the magnitude of the current in transistor M3 which in turn lowers the output common-mode voltage of the differential buffer. This embodiment is more process sensitive than the previous embodiments (e.g., there is more output common-mode voltage variation with changes in temperature, power supply voltage, and processing).

Figure 5:
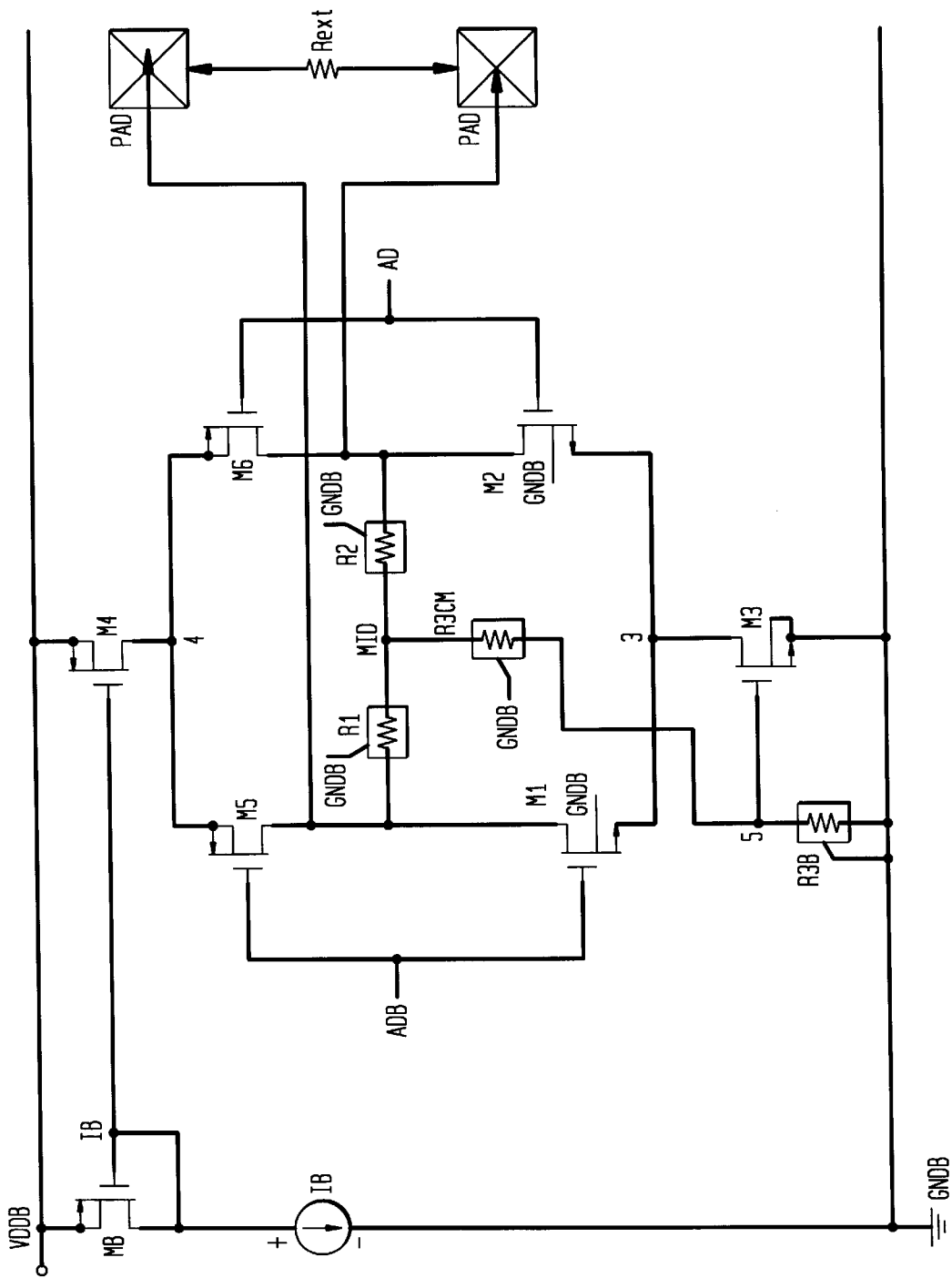
FIG. 5 is a schematic drawing of a fourth embodiment of a common-mode output voltage control circuit according to the present invention.

Alternatively, FIG. 5 shows another alternative to the circuit of FIG. 2. In this circuit, transistors M3CM and M3B are replaced by resistors R3CM and R3B, respectively. This allows a designer to select a resistor ratio of R3CM to R3B to set the common-mode output voltage over a wide range of voltages. The circuit of FIG. 5, having fixed resistances R3CM and R3B, will not have the flexibility of the circuit of FIG. 3, since once the resistor ratio R3CM to R3B is selected, it cannot be changed. This configuration, however, still allows flexibility in selection of the desired, common-mode output voltage. Further, the resistor ratios could be mask programmable by changing metal routing. Alternatively, one or both resistors R3CM and R3B could comprise series or parallel resistor combinations. Individual resistor contributions to the equivalent resistances could then be controlled by including transistors as switching elements. Thus, digital signals could control the ratio or R3CM to R3B.

In circuit simulation of the FIG. 5 circuit conducted by the applicant, this embodiment demonstrated equal or marginally better performance than the circuit of FIG. 2, with respect to output common-mode voltage variation changes in temperature, power supply voltage, and processing.

Having thus described a few particular embodiments of the invention, various alterations, modifications, and improvements will readily occur to those skilled in the art. For example, the circuits presented could also be implemented by fixing the current n M3B and allowing the current in M4 to be adjusted. This could be accomplished by exchanging the N and P transistors of FIG. 2 and swapping the power supply connections. Further, the circuits could be constructed in a bipolar implementation. Such alterations, modifications and improvements as are made obvious by this disclosure are intended to be part of this description though not expressly stated herein, and are intended to be within the spirit and scope of the invention. The foregoing description is by way of example only, and not limiting. The invention is limited only as defined in the following claims and equivalents thereto.

What is claimed is:

1. A device for controlling the common-mode output voltage of a differential buffer to a desired value, comprising:

a first current source providing a first current to the outputs of said differential buffer;

a second current source providing a second current to the outputs of said differential buffer, said second current being opposite in polarity and lower in magnitude than said first current;

sensing means for sensing the common-mode output voltage of said differential buffer and providing an adjustment current at a node of said sensing means; and adding means for adding said adjustment current to said second current to adjust the common-mode output voltage to said desired value.

2. A device set forth in claim 1, wherein said adding means comprises a first transistor connected between said sensing means and said second current source.

3. A device as set forth in claim 1, wherein said adding means comprises a resistance device connected between said sensing means and said second current source.

4. A device a set forth in claim 2, wherein said first transistor has its source and bulk node connected to said node of said sensing means, its drain connected to said second current source, and its gate connected to ground.

5. A device as set forth in claim 3, wherein said first transistor is a P-channel transistor.

6. A device as set forth in claim 2, wherein said second current source comprises an impedance device connected between the drain of said first transistor and ground, and a second transistor connected in a common-source configuration and having its gate connected to the drain of said first transistor.

7. A device as set forth in claim 6, wherein said impedance device comprises resistance means.

8. A device as set forth in claim 7, wherein said resistance means comprises a fixed resistor.

9. A device as set forth in claim 7, wherein said resistance means comprises a variable resistance source.

10. A device as set forth in claim 6, wherein said impedance device comprises a transistor.

11. A device as set forth in claim 3, wherein said second current source comprises an impedance device connected between said resistance device and ground, and a transistor having its source connected to ground and its gate connected to the resistance device.

12. A device as set forth in claim 11, wherein said impedance device comprises resistance means.

13. A device as set forth in claim 12, wherein said resistance means comprises a fixed resistor.

14. A device as set forth in claim 12, wherein said resistance means comprises a variable resistance source.

15. A device as set forth in claim 11, wherein said impedance device comprises a transistor.

16. A device as set forth in claim 2, wherein said adding means further comprises level shifting means to adjust the gate-to-source voltage of said first transistor to a predetermined level, thereby allowing the common-mode output voltage to be controllable over a range of values.

17. A device as set forth in claim 1, wherein said sensing means comprises a pair of equal-valued resistors placed in series between the outputs of said differential buffer and wherein said sensing means node is located between said pair of resistors.

18. An integrated circuit including a device for controlling the common-mode output voltage of a differential buffer to a desired value, comprising:

a first current source providing a first current to the outputs of said differential buffer;

a second current source providing a second current to the outputs of said differential buffer, said second current being opposite in polarity and lower in magnitude than said first current;

sensing means for sensing the common-mode output voltage of said differential buffer and providing an adjustment current at a node of said sensing means; and adding means for adding said adjustment current to said second current to adjust the common-mode output voltage to said desired value.

19. An integrated circuit as set forth in claim 18, wherein said adding means comprises a first transistor connected between said sensing means and said second current source.

20. An integrated circuit as set forth in claim 18, wherein said adding means comprises a resistance device connected between said sensing means and said second current source.

21. An integrated circuit a set forth in claim 19, wherein said first transistor has its source and bulk node connected to said node of said sensing means, its drain connected to said second current source, and its gate connected to ground.

22. An integrated circuit as set forth in claim 20, wherein said first transistor is a P-channel transistor.

23. An integrated circuit as set forth in claim 19, wherein said second current source comprises an impedance device connected between the drain of said first transistor and ground, and a second transistor connected in a common-source configuration and having its gate connected to the drain of said first transistor.

24. An integrated circuit as set forth in claim 23, wherein said impedance device comprises resistance means.

25. An integrated circuit as set forth in claim 24, wherein said resistance means comprises a fixed resistor.

26. An integrated circuit as set forth in claim 24, wherein said resistance means comprises a variable resistance source.

27. An integrated circuit as set forth in claim 23, wherein said impedance device comprises a transistor.

28. An integrated circuit as set forth in claim 20, wherein said second current source comprises an impedance device connected between said resistance device and ground, and a transistor having its source connected to ground and its gate connected to the resistance device.

29. An integrated circuit as set forth in claim 28, wherein said impedance device comprises resistance means.

30. An integrated circuit as set forth in claim 29, wherein said resistance means comprises a fixed resistor.

31. An integrated circuit as set forth in claim 29, wherein said resistance means comprises a variable resistance source.

32. An integrated circuit as set forth in claim 28, wherein said impedance device comprises a transistor.

33. An integrated circuit as set forth in claim 19, wherein said adding means further comprises level shifting means to adjust the gate-to-source voltage of said first transistor to a predetermined level, thereby allowing the common-mode output voltage to be controllable over a range of values.

34. An integrated circuit as set forth in claim 18, wherein said sensing means comprises a pair of equal-valued resistors placed in series between the outputs of said differential buffer and wherein said sensing means node is located between said pair of resistors.

35. A method of controlling the common-mode output voltage of a differential buffer to a desired value, comprising the steps of:
   supplying a first current to the outputs of said differential buffer;
   supplying a second current to the outputs of said differential buffer, said second current being opposite in polarity and lower in magnitude than said first current;
   sensing the common-mode output voltage of said differential buffer and providing an adjustment current at a node of said sensing means; and
   adding said adjustment current to said second current to adjust the common-mode output voltage to said desired value.

* * * * *